(12) United States Patent
Basu et al.

(10) Patent No.: US 9,397,226 B2
(45) Date of Patent: Jul. 19, 2016

(54) VERTICAL FIELD EFFECT TRANSISTORS WITH CONTROLLED OVERLAP BETWEEN GATE ELECTRODE AND SOURCE/DRAIN CONTACTS

(71) Applicant: International Business Machines Corporation, Armonk, NY (US)

(72) Inventors: Anirban Basu, Lagrangeville, NY (US); Cheng-Wei Cheng, White Plains, NY (US); Wilfried E. Haensch, Somers, NY (US); Amlan Majumdar, White Plains, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/938,904

(22) Filed: Nov. 12, 2015

(65) Prior Publication Data

US 2016/0149054 A1  May 26, 2016

Related U.S. Application Data

(62) Division of application No. 14/550,069, filed on Nov. 21, 2014, now Pat. No. 9,287,362.

(51) Int. Cl.
*H01L 21/02* (2006.01)
*H01L 29/786* (2006.01)
*H01L 29/66* (2006.01)
*H01L 29/423* (2006.01)

(52) U.S. Cl.
CPC .... *H01L 29/78696* (2013.01); *H01L 29/42392* (2013.01); *H01L 29/66742* (2013.01); *H01L 29/66977* (2013.01); *H01L 29/78642* (2013.01)

(58) Field of Classification Search
CPC ............ H01L 29/78696; H01L 29/78642; H01L 29/66977; H01L 29/66742; H01L 29/42392
See application file for complete search history.

(56) References Cited

U.S. PATENT DOCUMENTS 4,442,589 A   4/1984   Doo et al.
4,636,823 A   1/1987   Margalit et al.
(Continued)

OTHER PUBLICATIONS

Agarwal et al., "Design Optimization of Gate-All-Around Vertical Nanowire Transistors for Future Memory Applications", 978-1-4673-2523-3/13/$31.00, © 2013 IEEE.
Auth et al., "Scaling Theory for Cylindrical Fully-depleted, Surrounding-gate MOSFETs", IEEE Electron Device Letters, vol. 18, No. 2, pp. 74-76, Feb. 1997.
Frensley et al., "Design and Fabrication of a GaAs Vertical MESFET", IEEE Transactions on Electron Devices, vol. ED-32, No. 5, May 1985.
(Continued)

*Primary Examiner* — Long Pham
(74) *Attorney, Agent, or Firm* — Maeve Carpenter

(57) ABSTRACT

An approach to forming a semiconductor structure for a vertical field effect transistor with a controlled gate overlap. The approach includes forming on a semiconductor substrate, a first semiconductor layer, a second semiconductor layer, a third semiconductor layer, a fourth semiconductor layer, a fifth semiconductor layer, and a first dielectric layer. The etched first dielectric layer and a first drain contact are surrounded by a first spacer. The first drain contact is composed of the fifth semiconductor layer. A second drain contact composed of the fourth semiconductor layer, a channel composed of the third semiconductor layer, and a second source contact composed of the second semiconductor layer are formed. Additionally, first source contact composed of the first semiconductor is formed and a gate electrode is formed on a portion of the first source contact layer surrounding a portion of the first pillar and the second pillar.

14 Claims, 7 Drawing Sheets

(56) References Cited

U.S. PATENT DOCUMENTS

| | | |
|---|---|---|
| 4,805,003 A | 2/1989 | Holm et al. |
| 5,610,085 A | 3/1997 | Yuan et al. |
| 8,502,234 B2 | 8/2013 | Kizilyalli et al. |
| 2003/0013241 A1 | 1/2003 | Rockwell et al. |
| 2010/0019276 A1 | 1/2010 | Jang |
| 2010/0314695 A1 | 12/2010 | Bol |
| 2011/0253982 A1 | 10/2011 | Wang et al. |
| 2013/0270512 A1 | 10/2013 | Radosavljevic et al. |

OTHER PUBLICATIONS

Gandhi et al., "CMOS-Compatible Vertical-Silicon-Nanowire Gate-All-Around p-Type Tunneling FETs With ≤50-mV/decade Sub-threshold Swing", IEEE Electron Device Letters, vol. 32, No. 11, Nov. 2011.

Hofstein et al., "The Insulated Gate Tunnel Junction Triode", IEEE Transactions on Electron Devices, vol. 12, No. 2, pp. 66-76, Feb. 1965.

U.S. Appl. No. 14/550,069, filed Nov. 21, 2014.

List of IBM Patents or Patent Applications Treated as Related (Appendix P), filed herewith, 2 pages.

VERTICAL FIELD EFFECT TRANSISTORS WITH CONTROLLED OVERLAP BETWEEN GATE ELECTRODE AND SOURCE/DRAIN CONTACTS

BACKGROUND OF THE INVENTION

The present invention relates generally to the field of semiconductor technology, and more particularly to semiconductor structures controlling overlap between gate and source/drain contacts in vertical gate-all-around field effect transistors.

Semiconductor device scaling to smaller feature sizes for the last four decades, is facing significant challenges, such as increases in power consumption as increasing OFF-state leakage and non-scalability of the operating voltage, in pursuit of faster device performance. Traditional semiconductor design techniques, processes and materials become ineffective as physical dimensions shrink down to the nanometer regime. The use of gate-all-around metal-oxide semiconductor field effect transistors (MOSFETs) with small area of cross-section gives rise to be better electrostatic control of the channel and thus, leads to lower OFF-state leakage current.

In response to the challenges creating electron barriers in the nanometer regime, a new type of field-effect transistor (FET) for low energy electronics has been developed. A tunnel field-effect transistor (TFET) operates or switches by modulating quantum tunneling through a barrier instead of modulating thermionic emission over a barrier as done in traditional MOSFET technology. Similar in structure to a MOSFET except that the source and drain contacts are doped with the opposite type doping materials, a TFET commonly includes an "intrinsic" layer forming a p-type, intrinsic, n-type (P-I-N) junction in which the electrostatic potential in the intrinsic region is controlled by a gate terminal.

MOSFETs can be either n-channel MOSFETs (NFETs) or p-channel MOSFETs (PFETs). In NFETs, the source contact and the drain contact are doped with n-type doping material. In PFETs, the source contact and the drain contact are doped with p-type doping material. Similarly, TFETs can be either n-channel TFETs (N-TFETs) or p-channel TFETs (P-TFETs). In N-TFETs, the source contact is doped with p-type doping material and the drain contact is doped with n-type doping material. In P-TFETs, the source contact is doped with n-type doping material and the drain contact is doped with p-type doping material.

SUMMARY

Embodiments of the present invention provide a method of forming a vertical field effect transistor with a controlled gate overlap. The method includes forming on a semiconductor substrate, a first semiconductor layer, a second semiconductor layer, a third semiconductor layer, a fourth semiconductor layer, a fifth semiconductor layer, and a first dielectric layer. Additionally, the method includes forming a first pillar on a portion of the fourth semiconductor layer composed of the first dielectric layer and a first drain contact surrounded by a deposited first spacer where the first drain contact is composed of the fifth semiconductor layer. The method includes forming a second pillar below the first pillar. The second pillar includes a second drain contact composed of the fourth semiconductor layer, a channel composed of the third semiconductor layer, and a second source contact composed of the second semiconductor layer. Furthermore, the method includes forming a first source contact composed of the first semiconductor layer and a gate electrode on a portion of the first source contact surrounding a portion of the first pillar and the second pillar.

A semiconductor structure for a vertical field effect transistor including a semiconductor substrate, a first source contact on a portion of the semiconductor substrate, a pillar composed of a second source contact on the first source contact, a channel on the second source contact, a second drain contact on the channel, a first drain contact on a portion of the second drain contact, a patterned first dielectric layer, and a first spacer on a portion of the second drain contact surrounding the first drain contact and the patterned first dielectric layer. Additionally, a second spacer is on a gate electrode and the gate electrode and the second spacer surround the pillar.

DETAILED DESCRIPTION

Figure 1:
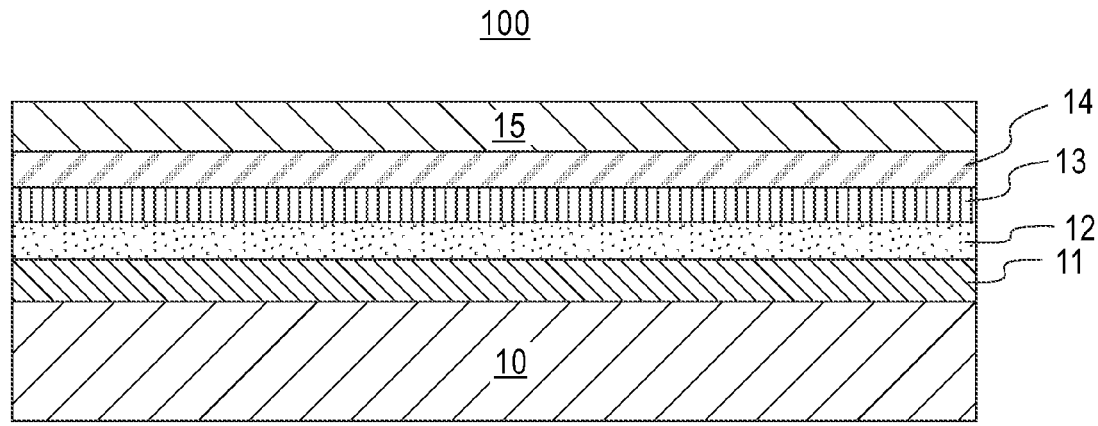
FIG. 1 depicts a cross-sectional view of a wafer after fabrication steps to form semiconductor device layers for a vertical FET, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention.

New device engineering is indispensable in overcoming difficulties of advanced metal-oxide-semiconductor field effect transistors (MOSFETs) and realizing high performance large scale integrations under, for example, the 10 nm gate-length regime. In addition to the improvements of gate stacks using metal gates, high k gate dielectrics and new channel geometries, such as the vertical MOSFET, and new transistors, such as the vertical TFET, are needed for enhancing the performance of device circuits and chips.

Vertical TFET and vertical MOSFET structures may include a gate wrapped around or encompassing the channel, the source contact, and the drain contact. Such structures may be called gate-all-around vertical FET or gate-all-around vertical MOSFET. Vertical TFET and vertical MOSFET devices with gate-all-around structures are especially advantageous, offering better electrostatic control over the channel. The control over the channel is enhanced by the gate surrounding the channel area, thus better controlling the channel to reduce leakage current and other short-channel effects. Vertical TFET and vertical MOSFET structures include source contacts and drain contacts which reside above and below the channel.

The region between the gate and the source contact and the gate and the drain contact of a FET is called the overlap region. The length of the overlap region determines the overlap capacitance of the FET. Overlap capacitance is a parasitic capacitance of the FET. Therefore, overlap capacitance is designed to be as low as possible in FET technologies. A precise control of the length of the overlap region and the overlap capacitance is highly desired. In conventional planar MOSFETs, the length of the overlap region is determined by ion implantation and therefore, this length can be controlled in a fairly precise manner. A challenge for the vertical FET structures has been the precise control of the length of the overlap region. In embodiments of the present invention, we disclose vertical MOSFET and vertical TFET structures that achieve precise control of the length of the gate overlap region.

Embodiments of the present invention include structures and methods to form vertical gate-all-around FET devices with controlled overlap between the gate electrode and the source contact and the gate electrode and the drain contact. Embodiments of the present invention recognize that creating vertical gate-all-around TFET and vertical gate-all-around MOSFET with controlled overlap regions between the gate and source contact or gate and drain contact challenges processes in nanometer technology. The gate electrode overlap of the source contact and the gate electrode overlap of the drain contact are often either underlapped or overlapped. When the gate electrode and source or drain contacts are underlapped, series resistance of the FET is high. High series resistance degrades the ON-current of the FET that in turn slows down the FET. When a gate overlaps the source contact or the drain contact too much, the overlap capacitance for the FET is high that in turn also slows down the FET.

Embodiments of the present invention include structures and methods to create vertical gate-all-around MOSFET and vertical gate-all-around TFET structures using multiple spacers and etch stop layers in the epitaxial semiconductor layers to control gate electrode overlap of the source contact and gate electrode overlap of the drain contact. Furthermore, semiconductor devices with more precise control over the source, drain, and channel due to semiconductor material deposition processes. Epitaxial growth processes which may include in-situ doping provide better control for the semiconductor layers and materials used in vertical devices.

FIG. 1 depicts a cross-sectional view of wafer 100 after fabrication steps to form semiconductor device layers. As depicted, FIG. 1 includes substrate 10, layer 11, layer 12 forming a second source, layer 13, layer 14, and layer 15. The semiconductor layers such as layer 11, layer 12, layer 13, layer 14, and layer 15 are formed using epitaxial growth processes known to one skilled in the art. For example, metal-organic chemical vapor deposition (MOCVD), atomic layer deposition (ALD), or molecular beam epitaxy (MBE) may be used for epitaxial growth of the semiconductor layers in FIG. 1 although other deposition methods may be used in some embodiments.

Substrate 10 may be a semiconductor substrate layer or an insulator substrate layer or a combination of the two. Substrate 10 may be composed of any semiconductor material including, for example, Si, SiGe, SiGeC, SiC, Ge, GaAs, InAs, InP, or other III-V compound semiconductor materials, or HgTe, CdTe, HgCdTe, or other II-VI compound semiconductor materials. Substrate 10 may also be composed of insulating materials such as, but not limited to, sapphire. Substrate 10 may be doped, undoped, or contain doped or undoped regions or, may be a layered semiconductor substrate such as a semiconductor-on-insulator substrate. Substrate 10 may be strained, unstrained or a combination thereof. Substrate 10 may also consist of two materials with different lattice constants, in which case the upper portion of the substrate is grown thick such that the upper portion has a low density of defects (this is often called "virtual" substrate) and therefore, the upper portion is of device quality, that is, a quality level capable of use in fabricating semiconductor devices and circuits.

The composition and semiconductor materials used in the semiconductor layers, layers 11, 12, 14, and 15, may be determined as discussed below in reference to the energy band diagrams depicted in FIGS. 2A-2D. FIGS. 2A-2D depict the energy band diagrams used in the embodiments of the present invention. In solid-state physics, a bandgap is an energy range in a solid wherein electron states cannot exist. In general for semiconductor chips, bandgap energy (i.e., $E_G$) refers to the energy difference (in electron volts) between the top of the valence band (i.e. $E_V$) and the bottom of the conduction band (i.e. $E_C$) in semiconductor materials and in insulator materials. The bandgap is equivalent to the energy required to free an outer shell electron from its orbit about the nucleus to become a mobile charge carrier, able to move freely within the solid material and thus, is a major factor in determining the electrical conductivity of a semiconductor material.

FIGS. 2A-2D are representative energy band diagrams for n-channel MOSFET (NFET), p-channel MOSFET (PFET), N-TFET and P-TFET, respectively. FIGS. 2A-2D are representative diagrams, however, the shape of the energy band diagrams for some semiconductor materials may be different than the shape depicted the energy band diagrams of FIGS. 2A-2D. As depicted in FIGS. 2A-2D, the vacuum level energy is denoted by $E_{VAC}$, the Fermi level energy is denoted by $E_F$, and the bottom of the conduction band energy is denoted by $E_C$. Additionally, in solid-state physics, electron affinity (denoted by $E_A$) is the energy required to extract an electron from the bottom of the conduction band just inside the semiconductor (i.e. $E_C$) to the vacuum just outside of the semiconductor (i.e. $E_{VAC}$). The subscripts to the electron affinity and the bandgap energy depicted refer to semiconductor material of the semiconductor layer in FIG. 1. For example, $E_{A(11)}$ is the electron affinity for the semiconductor material of semiconductor layer 11. Bandgap engineering principles and FIGS. 2A-2D may be used to illustrate the process for selecting or determining the semiconductor materials used for semiconductor layers 11, 12, 14, and 15.

Layer 11 may be used as a first source contact. As known to one skilled in the art, for MOSFET devices, a source contact may be used as a drain contact and vice versa. Layer 11 is a layer of a heavily doped first semiconductor material. The thickness of layer 11 is in the range from 10 nm to 50 nm, but not limited to this range. Layer 11 may be any semiconductor material deposited using known epitaxial growth processes such as MBE or MOCVD. The first semiconductor material used in layer 11 may be heavily doped using conventional methods such as ion implantation or the doping may be incorporated as a part of the epitaxial growth process (e.g., in-situ doping during MBE or MOCVD).

For a vertical MOSFET, the first semiconductor material (i.e., layer 11) may have the same doping polarity as the completed MOSFET device. For example, a vertical NFET may be doped with an n-type doping material suitable for the semiconductor material of layer 11 and a vertical PFET may be doped with a p-type doping material suitable for the semiconductor material of layer 11. In an exemplary embodiment, layer 11 may be $In_{0.53}Ga_{0.47}As$ doped with n-type silicon (Si), selenium (Se) or tellurium (Te) in a NFET and layer 11 may be Si doped with boron (B) in a PFET. The semiconductor material used in layer 11 is not intended to be limited to these materials but, may be any semiconductor material meeting the electron affinity and/or bandgap energy requirements outlined below.

Figure 2A:
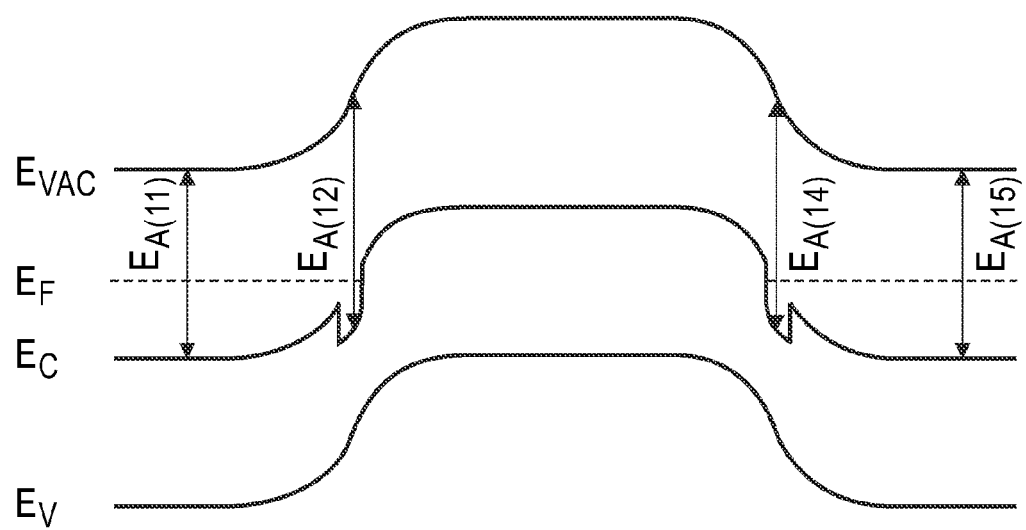
FIG. 2A depicts the energy band diagram of a vertical n-channel MOSFET (NFET), in accordance with an embodiment of the present invention.
Figure 2B:
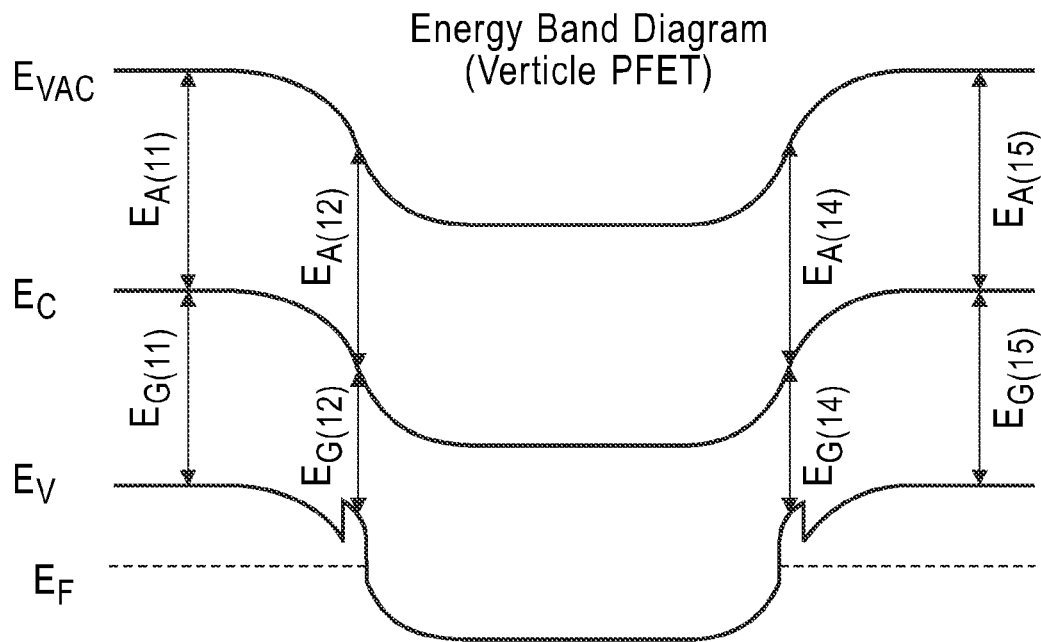
FIG. 2B depicts the energy band diagram of a vertical p-channel MOSFET (PFET), in accordance with an embodiment of the present invention.
Figure 2C:
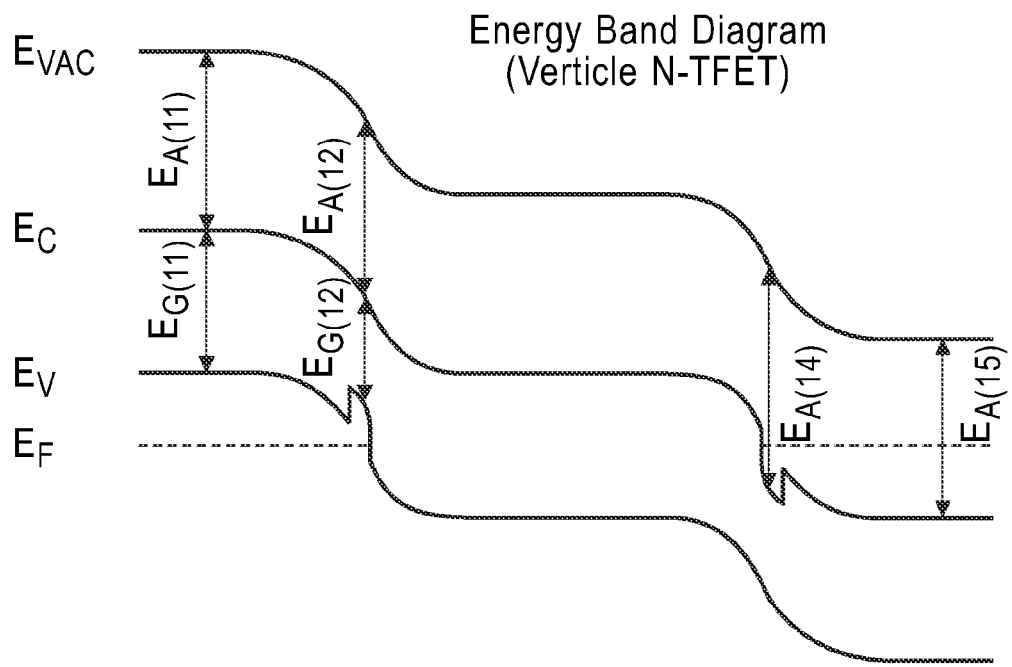
FIG. 2C depicts the energy band diagram of a vertical n-channel TFET (N-TFET), in accordance with an embodiment of the present invention.
Figure 2D:
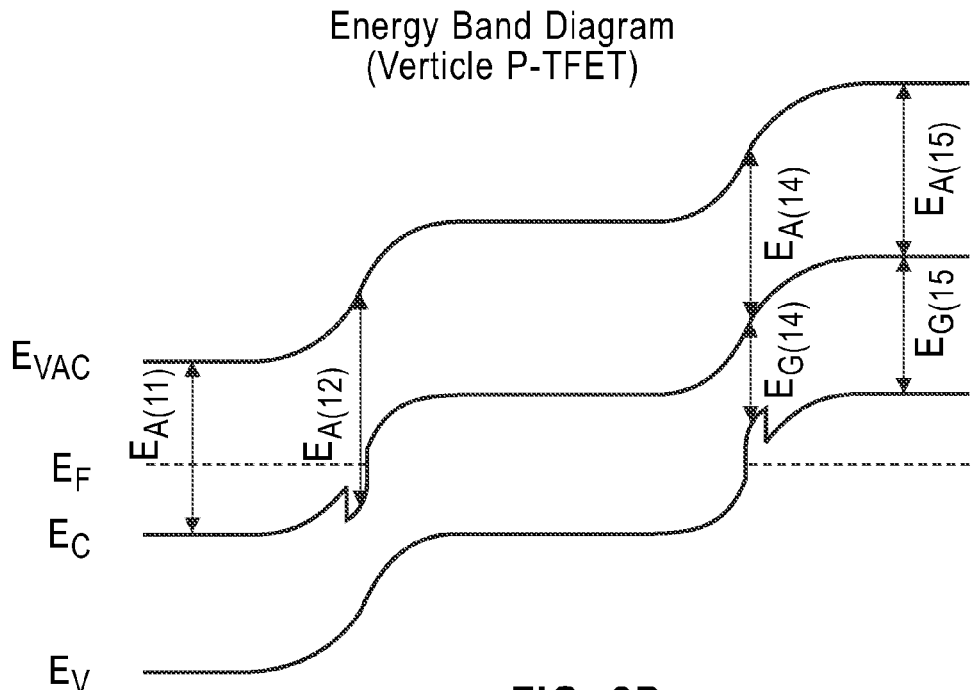
FIG. 2D depicts the energy band diagram of a vertical p-channel TFET (P-TFET), in accordance with an embodiment of the present invention.

For a vertical TFET, the first semiconductor material (i.e., layer 11) may have the opposite doping polarity as the device polarity (as shown in FIG. 2C for a vertical N-TFET and FIG. 2D for a vertical P-TFET). For example, a vertical N-TFET may be doped with a p-type doping material suitable for the semiconductor material of layer 11 and a vertical P-TFET may be doped with an n-type doping or n-type dopant material suitable for the semiconductor material of layer 11. In an exemplary embodiment, layer 11 may be Si doped with B for an N-TFET or $In_{0.53}Ga_{0.47}As$ doped with n-type Si, Se, or Te for a P-TFET. The semiconductor material used in layer 11 is not intended to be limited to these materials but, may be any semiconductor material meeting the electron affinity and/or bandgap energy requirements outlined below Layer 12 is a layer of a heavily doped second semiconductor material and may be used as a second source contact. Layer 12 may be any semiconductor material deposited using known epitaxial growth processes such as MBE or MOCVD. The second semiconductor material used in layer 12 may be doped using conventional methods such as ion implantation or may be incorporated as a part of the epitaxial growth process (e.g., in-situ doping during MBE or MOCVD).

The thickness of layer 12 determines, in part, the gate overlap. In an embodiment, the thickness of layer 12 is in the range from 5 nm to 10 nm but not limited to this range. For example, the gate deposited in a later process step, will be adjacent to the second source which is layer 12 thus, creating a portion of the gate overlap. Controlling the gate overlap of the second source occurs by controlling the thickness of the second semiconductor layer (i.e., layer 12). The thickness of layer 12 controls a portion of the gate overlap of the source contact, composed of the first source contact and the second source contact, in a vertical FET and a vertical TFET.

The semiconductor material of layer 12 should not form a barrier to current flow between the first source contact (i.e., layer 11) and the channel, formed in later process steps from layer 13. Therefore, referring to FIG. 2A, for a vertical NFET, layer 12 may be composed of any other appropriate semiconductor material with an electron affinity, $E_{A(12)}$ greater than or equal to the electron affinity, $E_{A(11)}$ of the first semiconductor material (i.e., layer 11) forming the first source contact. In other words, layer 12 in a vertical NFET, may be composed of any appropriate semiconductor material whose electron affinity as compared to the electron affinity of the first semiconductor material of layer 11 is greater than or equal to the electron affinity of layer 11. While as depicted in FIG. 2B, for a vertical PFET, layer 12 may be composed of any other appropriate semiconductor material with a combined electron affinity, $E_{A(12)}$ and bandgap, $E_{G(12)}$ less than or equal to the combined electron affinity, $E_{A(11)}$ and bandgap, $E_{G(11)}$ of the first semiconductor material (i.e., layer 11).

Referring to FIG. 2C, for a vertical N-TFET, layer 12 may be composed of any other appropriate semiconductor material with a combined electron affinity and bandgap (i.e., $E_{A(12)}$ plus $E_{G(12)}$) that is less than or equal to the combined electron affinity and bandgap of the first semiconductor material of layer 11 (i.e., $E_{A(11)}$ plus $E_{G(11)}$). While using the energy band diagram of FIG. 2D, for a vertical P-TFET, layer 12 may be composed of any other appropriate semiconductor material with an electron affinity, $E_{A(12)}$ greater than or equal to the electron affinity, $E_{A(11)}$ of the first semiconductor material (i.e., layer 11).

For a vertical MOSFET, the second semiconductor material (i.e., layer 12) may have the same doping polarity as the device polarity. For example, a vertical NFET may be doped with an n-type doping material suitable for the semiconductor material of layer 12 and a vertical PFET may be doped with a p-type doping material suitable for the semiconductor material of layer 12. In an exemplary embodiment, layer 12 may be InAs doped with Si, Se, or Te for an NFET or $Si_{0.7}Ge_{0.3}$ doped with p-type B for a PFET, however, is not limited to these materials.

While for a vertical TFET, the second semiconductor layer material (i.e., layer 12) may have the opposite doping polarity as the device polarity. A vertical N-TFET may be doped with a p-type doping material suitable for the semiconductor material of layer 12, and a vertical P-TFET may be doped with an n-type doping material suitable for the semiconductor material of layer 12. In an exemplary embodiment, layer 12 may be $Si_{0.7}Ge_{0.3}$ doped with p-type B in an N-TFET while a P-TFET may be InAs doped with Si, Se, or Te but, is not limited to these materials.

Layer 13 acts as a channel layer and is composed of a channel semiconductor material. Layer 13 may be a third semiconductor material which is a different semiconductor material than the second semiconductor material and first semiconductor material. In an embodiment, the channel semiconductor material of layer 13 may be the same as the first semiconductor material of layer 11 (i.e., the source contact layer). Layer 13 may be intrinsic (e.g., undoped) or lightly doped with the device type doping. The thickness of layer 13 is in the range from 5 nm to 50 nm but not limited to this range. In an exemplary embodiment, layer 13 may be undoped $In_{0.53}Ga_{0.47}As$ for an NFET and a P-TFET, or undoped Si for a PFET and an N-TFET, however, layer 13 is not limited to these materials.

Layer 14 forms a second drain layer. Layer 14 is composed of a heavily doped fourth semiconductor material. Layer 14 determines the overlap of the drain contact and the gate electrode when the vertical MOSFET and the vertical TFET devices are complete. Controlling the thickness of layer 14 controls gate overlap of the drain contact composed of the first drain contact and the second drain contact. Controlling the gate overlap occurs by controlling the thickness of layer 14 since no other part of the drain contact overlaps the gate electrode. Layer 14 may act as an etch stop for the first drain layer (i.e., layer 15) thus, insuring a controlled gate overlap area. The thickness of layer 14, deposited by a controlled epitaxial growth process, insures that the gate overlap of the drain contact (i.e., the second drain, layer 14 and the gate electrode, deposited as discussed with reference to FIG. 5 as layer 55) is adequate for semiconductor device performance but, not too large. The thickness of layer 14 is in the range from 5 nm to 10 nm but not limited to this range. Layer 14 may be any semiconductor material deposited using known epitaxial growth processes such as MBE or MOCVD.

Using FIGS. 2A-2D, the semiconductor material of layer 14 may be selected using the following principles where layer 14 should not form a barrier to current flow between the first drain contact (i.e., layer 15) and the channel (i.e., layer 13). Therefore, referring to FIG. 2A, for a vertical NFET, layer 14 may be composed of any other appropriate semiconductor material with an electron affinity, $E_{A(14)}$ greater than or equal to the electron affinity, $E_{A(15)}$ of the fourth semiconductor material (i.e., layer 15) deposited following layer 14. While as depicted in FIG. 2B, for a vertical PFET, layer 14 may be composed of any other appropriate semiconductor material with a combined electron affinity, $E_{A(14)}$ and bandgap, $E_{G(14)}$ less than or equal to the combined electron affinity, $E_{A(15)}$ and bandgap, $E_{G(15)}$ of the fourth semiconductor material (i.e., layer 15) deposited after layer 14.

Referring to FIG. 2A for a vertical NFET, layer 14 may be composed of any other appropriate semiconductor material with an electron affinity greater than or equal to the electron affinity of the fifth semiconductor material (i.e., layer 15) forming the first drain contact. Referring to FIG. 2B, for a vertical PFET, layer 14 may be composed of any other appropriate semiconductor material with a combined electron affinity and bandgap that is less than or equal to the combined electron affinity and bandgap of the fifth semiconductor material of layer 15 forming the first drain contact.

Referring to FIG. 2C, for a vertical N-TFET, layer 14 may be composed of any other appropriate semiconductor material with an electron affinity (i.e., $E_{A(14)}$) that is greater than or equal to the electron affinity of the fifth semiconductor material of layer 15 (i.e., $E_{A(15)}$). While using the energy band diagram of FIG. 2D, for a vertical P-TFET, layer 14 may be composed of any other appropriate semiconductor material with a combined electron affinity $E_{A(14)}$ and bandgap ($E_{G(14)}$) that is less than or equal to the combined electron affinity, $E_{A(15)}$ and bandgap ($E_{G(15)}$) of the fifth semiconductor material (i.e., layer 15).

The fourth semiconductor material used in layer 14 may be doped using conventional methods such as ion implantation or may be incorporated as a part of the epitaxial growth process (e.g., in-situ doping during MBE or MOCVD). For a vertical MOSFET, the fourth semiconductor material (i.e., layer 14) may have the same doping polarity as the device polarity. For example, a vertical NFET may be doped with an n-type doping material suitable for the semiconductor material of layer 14 and a vertical PFET may be doped with a p-type doping material suitable for the semiconductor material of layer 14. In an exemplary embodiment, layer 14 may be InAs doped with Si, Se, or Te for an NFET or $SI0.7Ge0.3$ doped with p-type B for a PFET but, is not limited to these materials.

While for a vertical TFET, the fourth semiconductor layer material (i.e., layer 14) may have the opposite doping polarity as the device polarity. For example, a vertical N-TFET may be doped with a p-type doping material suitable for the semiconductor material of layer 14 and a vertical P-TFET may be doped with an n-type doping material suitable for the semiconductor material of layer 14. In an exemplary embodiment, an N-TFET, layer 14 may be $Si_{0.7}Ge_{0.3}$ doped with P or As while a P-TFET may be InAs doped with p-type zinc (Zn) or carbon (C) however, layer 14 is not limited to these materials.

Layer 15 may form a drain contact. Layer 15 may be composed of a heavily doped fifth semiconductor material. The thickness of layer 15 can be, but not limited to, in the range of 10 nm to 50 nm. Layer 15 may be any semiconductor material deposited using known epitaxial growth processes such as MBE or MOCVD.

The fifth semiconductor material used in layer 15 may be doped using conventional methods such as ion implantation or the doping may be incorporated as a part of the epitaxial growth process (e.g., in-situ doping during MBE or MOCVD). For a vertical MOSFET, the fourth semiconductor layer material (i.e., layer 15) may have the same doping polarity as the device polarity, as shown in FIG. 2A and FIG. 2B for a vertical NFET and a vertical PFET, respectively. For example, a vertical NFET may be doped with an n-type doping material suitable for the semiconductor material of layer 15 and a vertical PFET may be doped with a p-type doping material suitable for the semiconductor material of layer 15. In an embodiment, the semiconductor materials used for layer 15 may be the same materials as those used in layer 11 in FETs.

For a vertical TFET, the fifth semiconductor layer material (i.e., layer 15) may have the opposite doping polarity as the device polarity, as shown in FIG. 2C and FIG. 2D for a vertical N-TFET and a vertical P-TFET, respectively. For example, a vertical N-TFET may be doped with a p-type doping material suitable for the semiconductor material of layer 15 and a vertical P-TFET may be doped with an n-type doping material suitable for the semiconductor material of layer 15. In one embodiment, layer 15 in an N-TFET and may be composed of Si doped with phosphorus (P) or arsenic (As) while layer 15 may be $In_{0.53}Ga_{0.47}As$ doped with p-type Zn or C in a P-TFET.

Figure 3:
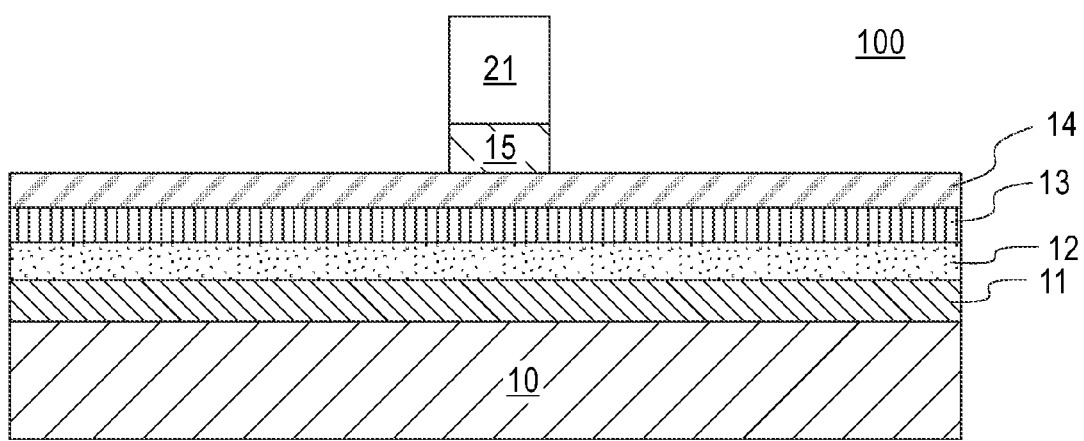
FIG. 3 depicts a cross-sectional view of the wafer after fabrication steps to form a first dielectric layer, in accordance with an embodiment of the present invention.

FIG. 3 depicts a cross-sectional view of wafer 100 after fabrication steps to form a first dielectric layer and a drain contact, in accordance with an embodiment of the present invention. As depicted, FIG. 3 includes the elements of FIG. 1 and a first dielectric layer (i.e., layer 21). Layer 21 is deposited on layer 15 (i.e., the first drain layer) and may be used as a chemical mechanical polish (CMP) stop layer in later processes. Layer 21 may be deposited using known deposition methods such as chemical vapor deposition (CVD) or ALD. Layer 21 is composed of the first dielectric material, for example, SiN, SiO2, SiON, other oxide compounds, nitride compounds, or other dielectric material similarly used in semiconductor device formation. The thickness of layer 21 may be in a range of 5 nm to approximately 50 nm.

Using photolithography or another conventional lithography process, layer 21 and layer 15 may be selectively patterned and etched to the top of layer 14 (i.e., the second drain layer). Layer 21 and layer 15 may be etched using known etch processes such as one or more appropriate chemical etch processes for the dielectric material and the semiconductor material, a reactive ion etch (RIE), or another suitable etch process. Selectively defined, layer 21 may be used as a CMP stop layer in later processes. In an embodiment, a hard mask layer (not shown) such as, but not limited to, SiN may be deposited on layer 21. Upon completion of etch, layer 21 and layer 15 form a circular pillar or column on the surface of layer 14. While the exemplary embodiment creates a circular pillar with layers 21 and 15, in other embodiments another shape such as a rectangular or square column may be created. Layer 15 forms the first drain contact.

Figure 4:
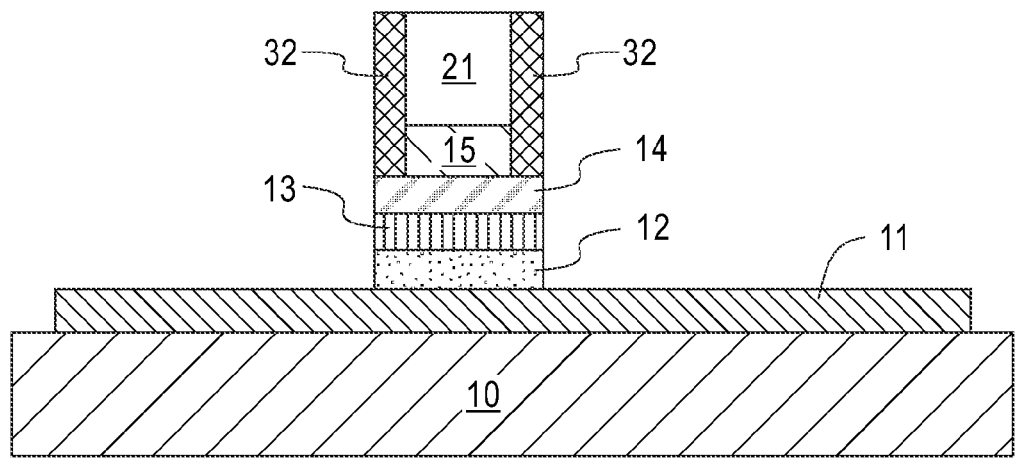
FIG. 4 depicts a cross-sectional view of the wafer after fabrication steps to form a first spacer and a source contact, in accordance with an embodiment of the present invention.

FIG. 4 depicts a cross-sectional view of wafer 100 after fabrication steps to form a first spacer, in accordance with an embodiment of the present invention. As depicted, FIG. 4 includes the elements of FIG. 3 and a patterned second dielectric layer, layer 32, forming a first spacer. The first spacer separates a portion of the drain, the first drain layer forming the drain contact from the gate electrode, to insure overlap area between the gate electrode and the drain is not too large. The layer 32 composed of a second dielectric material cannot be the same material as the first dielectric material and should be etched with different etchants than the first dielectric material.

The second dielectric layer, layer 32, may be deposited on wafer 100 with known deposition methods such as CVD or ALD. In an embodiment, layer 32 may be deposited as a conformal layer. The second dielectric material of layer 32 may be, for example, any dielectric material suitable for forming a spacer in a MOSFET or a TFET. However, the second dielectric material in layer 32 is different from the first dielectric material in layer 21. In an embodiment, the second dielectric material may be SiN or another nitride compound dielectric. In another embodiment, an oxide, for example, SiO2 may be used for the second dielectric material. The thickness of layer 32 may be in a range of 5 nm to approximately 10 nm. The thickness range and the shape of the first spacer (i.e., layer 32) may be different in other embodiments. For example, the first spacer formed from layer 32 may be less than 5 nm in another embodiment. In another embodiment, the spacer may have a different shape, for example, creating a square box around a pillar of layer 15 and layer 21 which may also be a box, a rectangle, a square or other geometric shape. In the exemplary embodiment, a first pillar or first column is formed on portion of the fourth semiconductor layer and is composed of the first dielectric layer (i.e., layer 21), the first drain contact (i.e., layer 15), and the first spacer (i.e., layer 32).

Using an anisotropic etch process, for example, an anisotropic wet etch or RIE, layer 32 may be selectively patterned, removing the dielectric material from horizontal surfaces. Layer 32 (i.e., the first spacer) may be formed around the pillar created from layer 15 (i.e., the first drain contact) and layer 21 (i.e., the first dielectric). Upon completion of the etch process, layer 32 forms a ring surrounding the pillar created from layers 15 and 21. Using the first dielectric (i.e., layer 21) and the first spacer (i.e. layer 32) as etch masks, layer 14 (the second drain contact), layer 13 (the channel), and layer 12 (the second source contact) are etched to the top of layer 11 (the first source contact). This is achieved using an anisotropic etch process, for example, an anisotropic wet etch or RIE that removes layers 14, 13, and 12 from the horizontal surfaces. In the exemplary embodiment, the second drain contact (i.e., layer 14), the channel (i.e., layer 13), and the second source contact (i.e., layer 12) form a second pillar or a second column under the first pillar. The location the second pillar, the first pillar on the first source contact (i.e., layer 11) is arbitrary and may be different than depicted in another embodiment. For example, the second pillar may be centered on the first source.

Using photolithography, layer 11 may be selectively patterned and etched to the top of layer 10, or in other words, to the semiconductor substrate. In an exemplary embodiment, layer 11 is etched in a rectangular shape as shown, forming a mesa or a raised region forming a first source contact on the semiconductor substrate. In the exemplary embodiment, layer 11 may have patterned dimensions in the range of 50 nm to 500 nm in length and 50 nm to 500 nm in width. However, in other embodiments, layer 11 may have different dimensions. In an embodiment, layer 11 forming the first source contact may be patterned to a different shape, for example, a circle.

Figure 5:
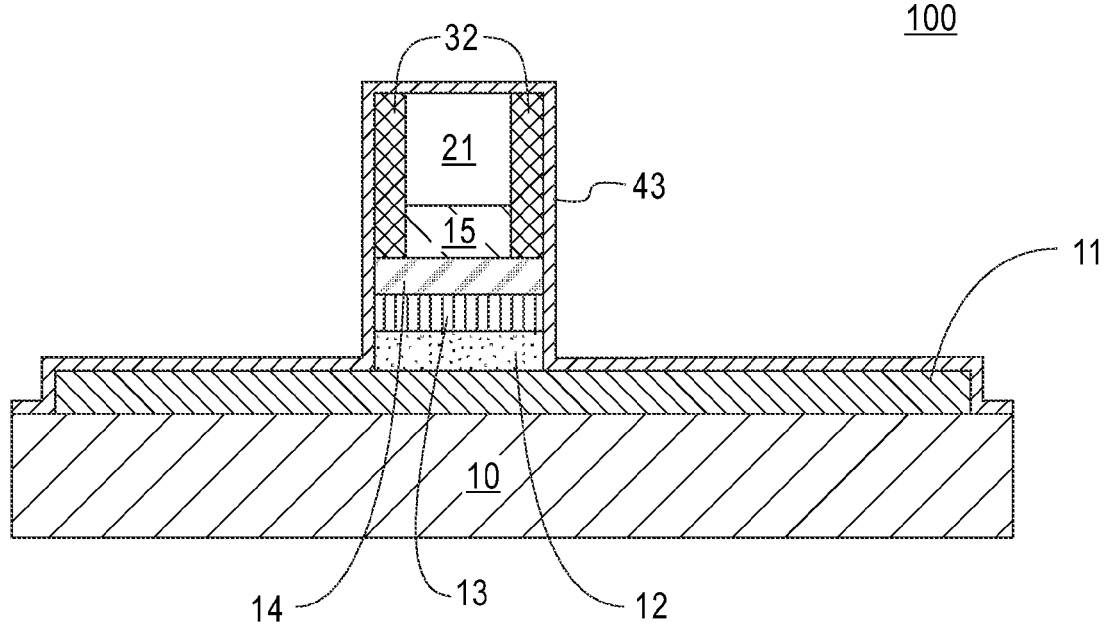
FIG. 5 depicts a cross-sectional view of the wafer after fabrication steps to deposit a gate dielectric layer, in accordance with an embodiment of the present invention.

FIG. 5 depicts a cross-sectional view of wafer 100 after fabrication steps to deposit a gate dielectric layer, in accordance with an embodiment of the present invention. As depicted, FIG. 5 includes the elements of FIG. 4 where a gate dielectric layer (i.e., layer 43) deposited over the top of the first dielectric layer (i.e., layer 21), around the first spacer (i.e., layer 32), around the patterned semiconductor layers 14, 13, 12, around and over a portion of layer 11, and over a portion of substrate 10. A conformal gate dielectric (i.e., layer 43) may be deposited using a suitable deposition technique including, but not limited to ALD, CVD, plasma enhanced chemical vapor deposition (PECVD), physical vapor deposition (PVD), or other similar deposition processes. Layer 43 may be composed of any appropriate gate dielectric material, such as but not limited to, SiO2, HfO2, ZrO2, TiO2, Al2O3, La2O3, Y2O3, LaAlO3, HfSiO2, and SrTiO3. In the exemplary embodiment, the gate dielectric (i.e., layer 43) has a thickness in the range of 1 nm to 5 nm. However, in other embodiments, the gate dielectric thickness may be less than 1 nm while in an embodiment, the gate dielectric thickness may be greater than 5 nm.

Figure 6:
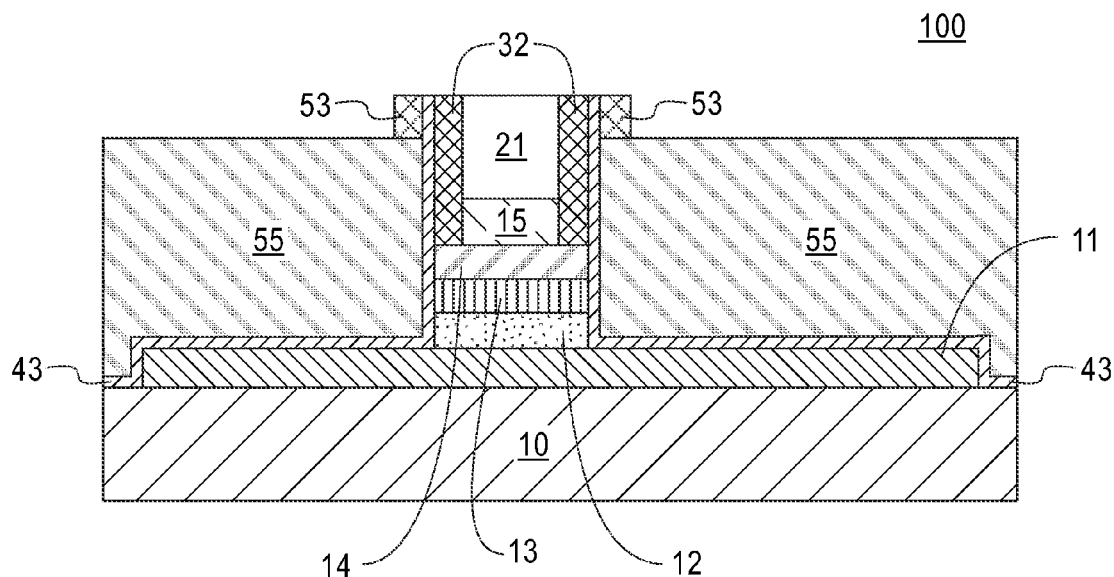
FIG. 6 depicts a cross-sectional view of the wafer after fabrication steps to deposit a gate electrode layer and form a second spacer, in accordance with an embodiment of the present invention.

FIG. 6 depicts a cross-sectional view of wafer 100 after fabrication steps to deposit a gate electrode layer and form a second spacer, in accordance with an embodiment of the present invention. As depicted, FIG. 6 includes the elements of FIG. 5 and a layer of gate electrode material deposited on the gate dielectric layer (i.e., layer 43) and a second dielectric spacer. In the exemplary embodiment, a gate electrode (i.e., layer 55) is deposited on the gate dielectric (i.e., layer 43). The gate electrode (i.e., layer 55) may be deposited by a known deposition method such as MBE, CVD, PECVD, ALD, PVD or other similar deposition methods. Layer 55 may be any suitable conductive material for a gate electrode, such as but not limited to, titanium, titanium nitride, tungsten, tantalum, tantalum nitride, platinum, gold, polysilicon, polysilicon germanium, polygermanium, conductive metal alloys, conductive nitrides, conductive oxides, and similar conductive materials or combination of conductive materials or layers. In some embodiments, the gate or gate electrode consisting of polysilicon, polysilicon germanium, or polygermanium may be doped with doping materials such as aluminum, boron, arsenic, phosphorous, antimony, gallium, or mixtures thereof.

In an exemplary embodiment, a CMP is performed on the gate electrode layer (i.e., layer 55), stopping on the first dielectric (i.e., layer 21) and the first spacer (i.e., layer 32). In some embodiments, gate dielectric (i.e., layer 43) may be removed from the top surfaces of the first dielectric (i.e., layer 21) and the first spacer (i.e., layer 32) by CMP.

A second spacer (i.e., layer 53) may be formed after removing a portion of the gate electrode (i.e., layer 55). A timed etch using a wet etch or RIE, for example, of the gate electrode material (i.e., layer 43) lowers the gate electrode top surface below the top surface of the first spacer (i.e., layer 32). In the exemplary embodiment, the gate electrode (i.e., layer 55) is etched 5 nm to 50 nm below the top surface of the first spacer (i.e., layer 32). In an embodiment, the gate electrode (i.e., layer 55) may be recessed to a different depth below the top surface of the first drain contact (i.e., layer 15) but should still overlap at least a portion of the second drain contact (i.e., layer 14).

A third dielectric material (i.e., layer 53) may be deposited on the top surface of the gate electrode (i.e., layer 55) adjacent to gate dielectric (i.e., layer 43). The width of layer 53 determines, at least in part, the gate overlap for the first source contact (i.e., layer 11). The third dielectric material should be different from the second dielectric material and use a different etchant than the second dielectric material. In an embodiment, the third dielectric material may be the same dielectric material as the first dielectric material. The third dielectric layer may be deposited by a known deposition method such as MBE, CVD, PECVD, ALD, PVD, or other similar dielectric deposition process. The third dielectric material (i.e., layer 53) may be composed of a SiO2 dielectric material in the exemplary embodiment. The third dielectric material may also be a dielectric material such as SiN, SiON, or a high-K dielectric.

Layer 53 may be etched with a suitable etch process to form the second spacer on layer 55. The second spacer composed of the third dielectric material (i.e., layer 53) wraps around the gate dielectric (i.e., layer 43), the first spacer (i.e., layer 32), and the first dielectric (i.e., layer 21). In the exemplary embodiment, the width of the second spacer formed from layer 53 is in the range of 5 nm to 50 nm. In other embodiments, the width of the second spacer may be different. For example, the width of the second spacer could be less than 5 nm. The width of the second spacer determines the width of the gate electrode after the gate electrode (i.e., layer 55) is patterned. The thickness of the gate electrode determines a portion of the gate overlap on the source contact (layer 11) for a TFET or the gate overlap of the source/drain contact (layer 11) for a MOSFET. Controlling the width of the second spacer and in result, the width of the gate electrode, controls a portion of the gate overlap due to the source contact in a TFET or a source/drain contact in a FET.

Figure 7:
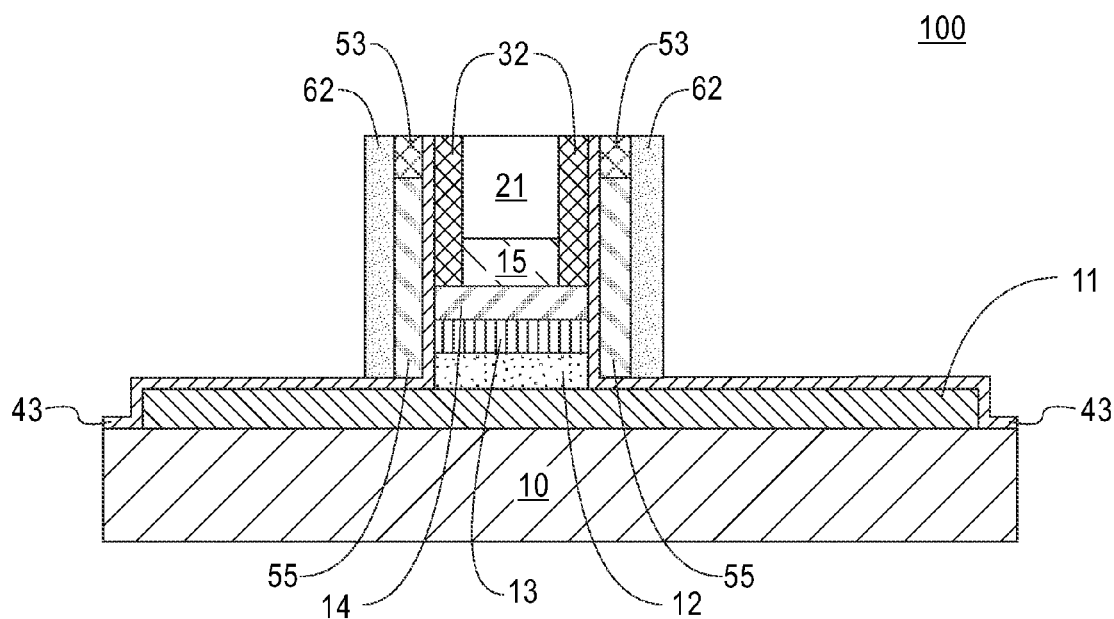
FIG. 7 depicts a cross-sectional view of the wafer after fabrication steps to form a gate electrode and a third spacer, in accordance with an embodiment of the present invention.

FIG. 7 depicts a cross-sectional view of wafer 100 after fabrication steps to the gate electrode and a third spacer, in accordance with an embodiment of the present invention. As depicted, FIG. 7 includes the elements of FIG. 6 and a fourth layer of a dielectric material forming a third spacer composed of layer 62. In the exemplary embodiment, the gate electrode (i.e., layer 55) is etched using a reactive ion etch (RIE) using the second spacer (i.e., layer 53), the first spacer (i.e., layer 32), the first dielectric (i.e., layer 21), and the gate dielectric (i.e., layer 43) as etch masks. In another embodiment, layer 55 may be etched with any other suitable etch process. Layer 55 (i.e., the gate electrode) wraps around layer 43 (i.e., the gate dielectric), which surrounds or wraps around layer 12 (the second source contact), layer 13 (the channel), layer 14 (the second drain contact), and layer 32 (i.e., the first spacer). The gate electrode formed from layer 55 resides on a portion of layer 43 (i.e., the gate dielectric) that is over a portion of layer 11 (e.g., source contact in a TFET or a source/drain contact in a MOSFET).

A third spacer may be formed from the fourth layer of dielectric material. The fourth layer of dielectric material (i.e., layer 62) may be deposited using known deposition techniques such as MBE, CVD, PECVD, ALD, PVD, or other suitable deposition process. Layer 62 is etched with a suitable process such as an anisotropic etch to remove the fourth dielectric material from the horizontal surfaces to form the third spacer. Layer 62 may be deposited over the gate dielectric (i.e., layer 43) surrounding the gate electrode (i.e., layer 55) and the second spacer (i.e., layer 53). In an embodiment, the fourth dielectric of layer 62 may be the same as the second dielectric material. However, the fourth dielectric material may be not the same material as the first dielectric material or the third dielectric material so that the etchant processes used on the fourth and second dielectric materials do not remove the first and the third dielectric materials. In an embodiment, the fourth dielectric material may be another dielectric such as SiN. In the exemplary embodiment, the fourth dielectric material may be a high-k dielectric material, for example, hafnium silicate or hafnium oxide. In one embodiment, a CMP process may be used to form a planar surface for layer 62. Layer 62 may be etched using a suitable etch process, for example, RIE, to the top of the gate dielectric layer (i.e., layer 43). The third spacer composed of the fourth dielectric material wraps around the gate electrode (i.e., layer 55) and the second spacer (i.e., layer 53). The thickness of layer 62 may be in the range of 5 nm to 50 nm.

Figure 8:
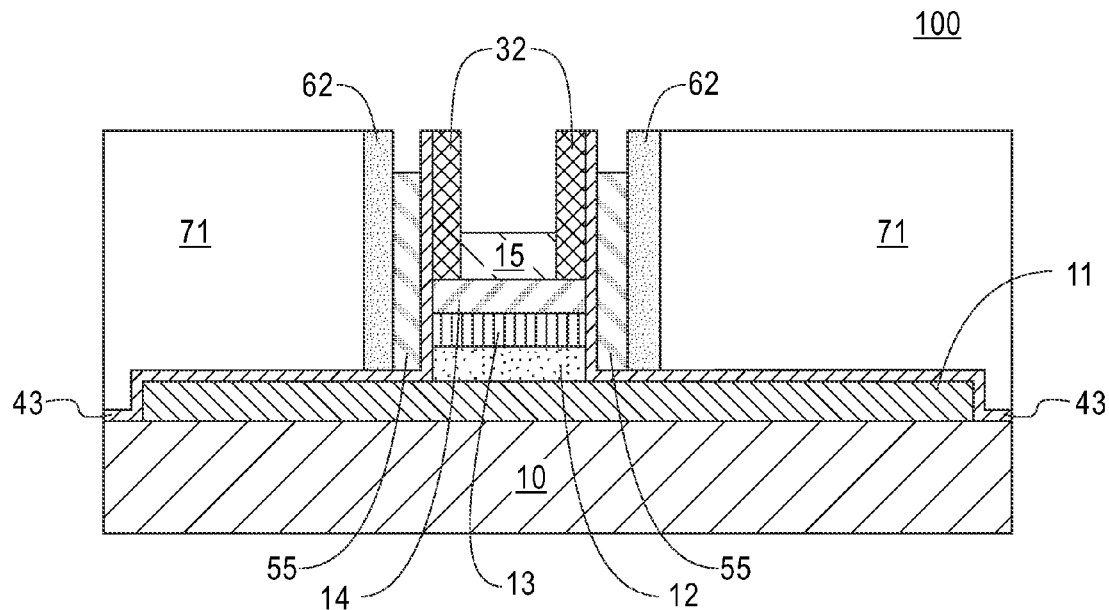
FIG. 8 depicts a cross-sectional view of the wafer after fabrication steps to deposit an interlayer dielectric and selectively remove dielectric material, in accordance with an embodiment of the present invention.

FIG. 8 depicts a cross-sectional view of wafer 100 after fabrication steps to deposit an interlayer dielectric and selectively remove dielectric material, in accordance with an embodiment of the present invention. As depicted, FIG. 8 includes the elements of FIG. 7 and an interlayer dielectric (ILD) 71 after removal of dielectric layers 21 and 53. Layer 71 is an ILD that is deposited over the exposed surfaces of layers 15, 32, 43, 55, and 62. The ILD (i.e., layer 71) may be deposited using suitable deposition processes. In an embodiment, layer 71 may be composed of a dielectric material such as SiO2 but, may be composed of different ILD materials in other embodiments. A CMP process may be performed on layer 71, stopping on the top surface of layers 32, 43, and 62.

The first dielectric material (i.e., layer 21) and the third dielectric material (i.e., layer 53) may be selectively removed, as depicted, for the later formation of a metal contact for the drain contact (i.e., layer 15) and a metal contact for the gate electrode (i.e., layer 55). A selective etch of layer 21 and layer 53 may be performed. Using known etch processes, such as RIE or a chemical etch, the first dielectric material (i.e., layer 21) may be removed exposing the top surface of the first drain layer (i.e., layer 15) and the third dielectric material (i.e., layer 53) may be removed exposing the top surface of the gate electrode (i.e., layer 55). The etch processes must be selective to layer 21 and layer 53 while inert or unreactive with other exposed dielectric materials, such as, layer 32 (i.e., the second dielectric material), layer 62 (i.e., the fourth dielectric material), and layer 71 (i.e., the ILD).

Figure 9:
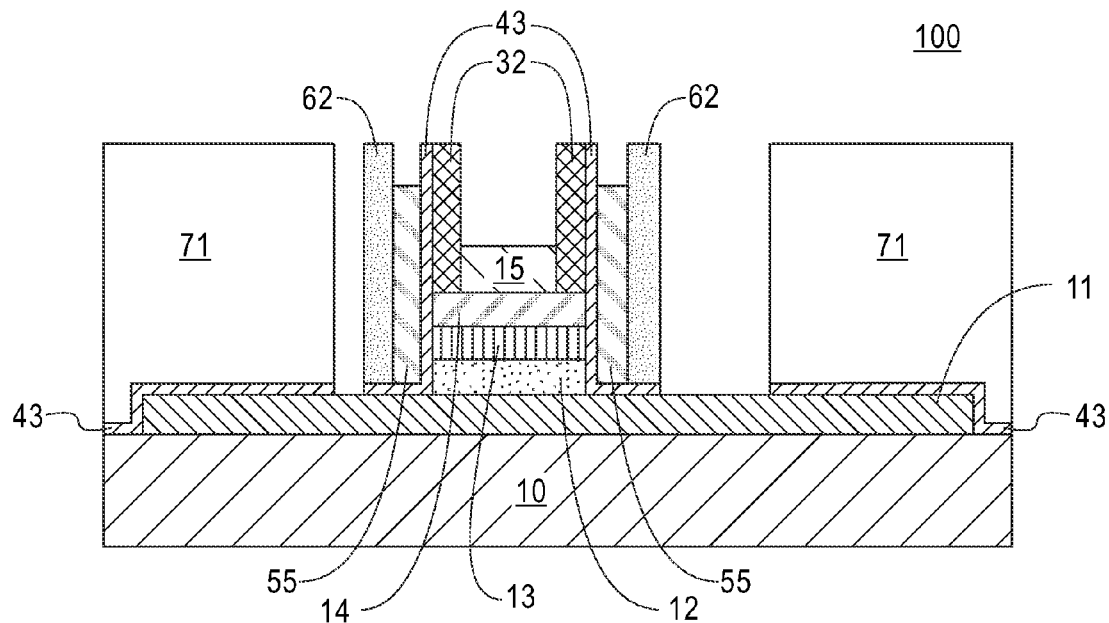
FIG. 9 depicts a cross-sectional view of the wafer after fabrication steps to selectively remove the interlayer dielectric and gate dielectric, in accordance with an embodiment of the present invention.

FIG. 9 depicts a cross-sectional view of wafer 100 after fabrication steps to selectively remove the interlayer dielectric and gate dielectric, in accordance with an embodiment of the present invention. As depicted, FIG. 9 includes the elements of FIG. 8 after selectively removing a portion of the ILD (i.e., layer 71) and a portion of the gate dielectric (i.e., layer 43). The areas where the ILD and the gate dielectric are removed may be used to deposit a metal or other conductive material to form electrical connections in later process steps. Using conventional lithography techniques, resist may be applied, and a selective etch of a portion of the ILD and a portion of the gate dielectric layer may be performed. In the exemplary embodiment, a rectangular shaped portion of layer 71 and layer 43 are removed, however, the portion of the layer 71 and layer 43 removed may form another geometric shape such as a square or a circle in another embodiment. The portion of the gate dielectric layer beneath the removed ILD material exposes a portion of the source contact (i.e., layer 11).

Figure 10A:
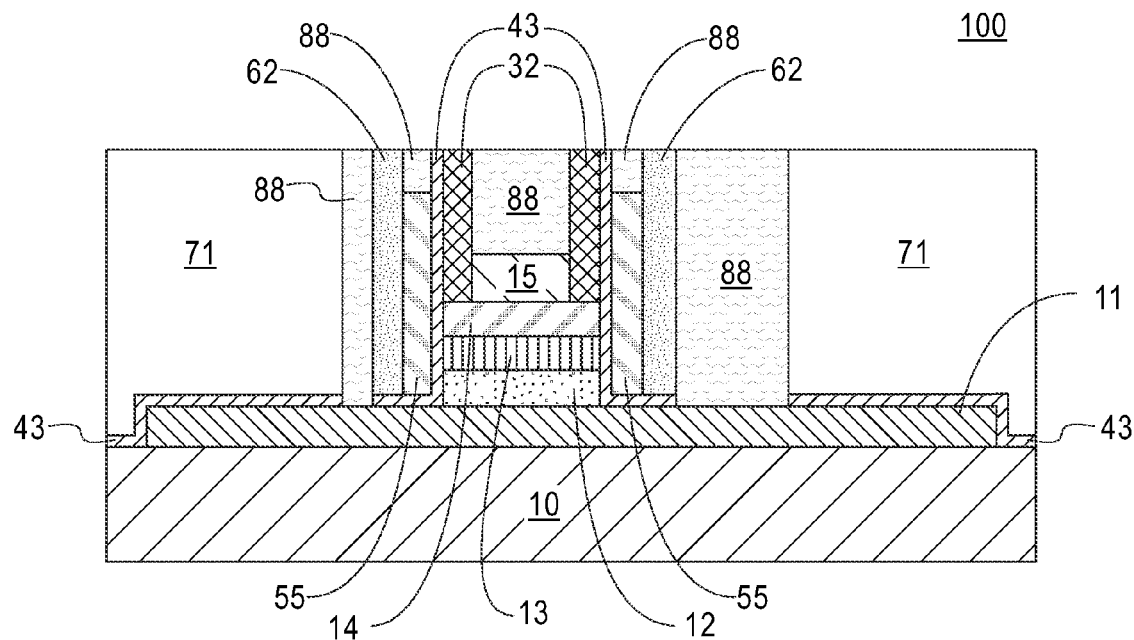
FIG. 10A depicts a cross-sectional view of the wafer after fabrication steps to form metal contacts, in accordance with an embodiment of the present invention.

FIG. 10A depicts a cross-sectional view of wafer 100 after fabrication steps to form metal contacts, in accordance with an embodiment of the present invention. As depicted, FIG. 10A includes the elements of FIG. 9 and the metal contacts after CMP. A contact metal (i.e., layer 88) may be deposited on wafer 100. Layer 88 may be composed of any suitable contact metal or electrically conductive material used in semiconductor device connections or wiring. In an embodiment, the contact metal of layer 88 may be tungsten. In another embodiment, the contact metal may be layered, such as TiN layered with tungsten or any other suitable backend of line (BEOL) contact metal such as copper, or another contact material or layered contact materials. Layer 88 may be deposited using a suitable deposition process on layer 11 (i.e., the source contact), layer 15 (i.e., the drain contact), and layer 55 (i.e., the gate electrode). A CMP may be performed on layer 88, stopping on the top surface of layers 32, 62, and 71 to form a planar surface which may be used for further BEOL interconnect layers, wiring and electrical connections.

Figure 10B:
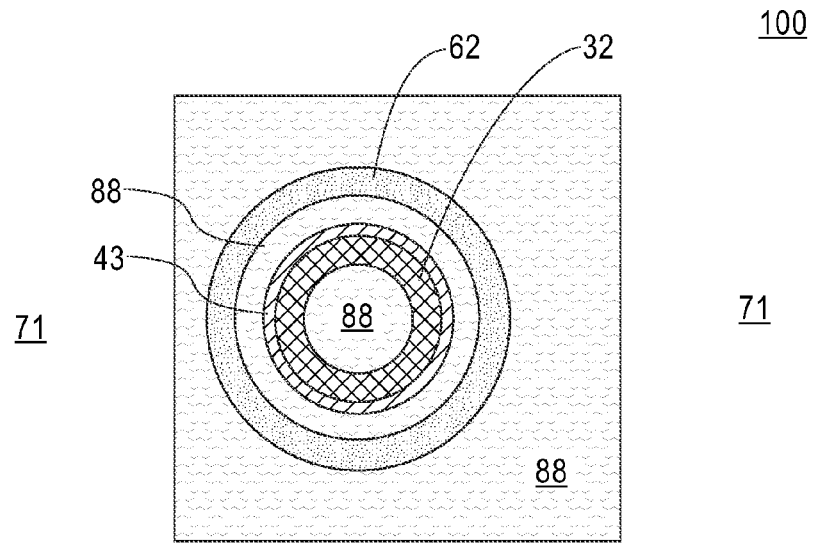
FIG. 10B is a top view of the wafer created using the steps presented in FIGS. 1 and 3-10A after a chemical mechanical polish process, in accordance with an embodiment of the present invention.

FIG. 10B depicts a plan view of wafer 100 created using the steps presented in FIGS. 1 and 3-10A after a chemical mechanical polish process. As depicted, FIG. 10B shows a portion of the top surface of wafer 100 with a portion of the ILD (i.e., layer 71) surrounding a rectangular shaped metal contact (i.e., layer 88) to the source (not shown), followed by a ring of the third spacer (i.e., layer 62) surrounding another metal contact which is a ring over the gate electrode (not shown), followed by a ring of the gate dielectric layer surrounding a first spacer also forming a ring, and a circular metal contact of layer 88 which is over the drain contact (not shown).

In some embodiments, the wafers formed by the embodiments of the present invention may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case the chip is then integrated with other chips, discreet circuit elements, motherboard or end product. The end product can be any product that includes integrated circuit chips, ranging from toys and other low-end applications to advanced computer products having a display, a keyboard or other input device and a central processor.

What is claimed is:

1. A method of forming a vertical field effect transistor with a controlled gate overlap, comprising:

forming on a semiconductor substrate, a first semiconductor layer, a second semiconductor layer, a third semiconductor layer, a fourth semiconductor layer, a fifth semiconductor layer, and a first dielectric layer;

forming a first pillar on a portion of the fourth semiconductor layer composed of the first dielectric layer and a first drain contact surrounded by a deposited first spacer, the first drain contact composed of the fifth semiconductor layer;

forming a second pillar below the first pillar including a second drain contact composed of the fourth semiconductor layer, a channel composed of the third semiconductor layer, and a second source contact composed of the second semiconductor layer;

forming a first source contact composed of the first semiconductor layer; and forming a gate electrode on a portion of the first source contact surrounding a portion of the first pillar and the second pillar.

2. The method of claim 1, wherein controlling the gate overlap for the second drain contact occurs by controlling a thickness of the fourth semiconductor layer.

3. The method of claim 1, wherein controlling the gate overlap for the second source contact occurs by controlling a thickness of the second semiconductor layer.

4. The method of claim 1, wherein a thickness of the gate electrode on a portion of the first semiconductor layer determines the gate overlap for the first source contact.

5. The method of claim 4, wherein forming the gate electrode further comprises:

depositing a gate dielectric layer;

depositing a third dielectric material on the gate electrode;

etching the third dielectric layer to form a second spacer on the gate electrode layer; and etching the gate electrode.

6. The method of claim 5, wherein the thickness of the formed second spacer determines a thickness of the gate electrode.

7. The method of claim 1, wherein the vertical field effect transistor is formed as a MOSFET.

8. The method of claim 7, further comprising forming a NFET, and wherein forming the NFET includes selecting a material for the second semiconductor layer and a material for the fourth semiconductor layer with an electron affinity greater than or equal to an electron affinity of a material of the first semiconductor layer and a material of the fifth semiconductor layer, respectively.

9. The method of claim 7, further comprising forming a PFET, and wherein forming the PFET includes selecting a material for the second semiconductor layer and a material for the fourth semiconductor layer with a combined electron affinity and bandgap energy less than or equal to a combined electron affinity and bandgap energy of a material of the first semiconductor layer and a material of the fifth semiconductor layer, respectively.

10. The method of claim 1, wherein the vertical field effect transistor is formed as a TFET.

11. The method of claim 10, further comprising forming a N-TFET, and wherein forming the N-TFET includes selecting a material for the second semiconductor layer with a combined electron affinity and bandgap energy less than or equal to a combined electron affinity and bandgap energy of a material of the first semiconductor layer.

12. The method of claim 10, further comprising forming a N-TFET, and wherein forming the N-TFET includes selecting a material for the fourth semiconductor layer with an electron affinity greater than or equal to an electron affinity of a material of the fifth semiconductor layer.

13. The method of claim 10, further comprising forming a N-TFET, and wherein forming the N-TFET includes doping the first semiconductor layer and second semiconductor layer with a p-type dopant, the third semiconductor layer is undoped, and doping the fourth semiconductor layer and the fifth semiconductor layer with a n-type dopant.

14. The method of claim 5, wherein forming the gate electrode further comprises:
   forming a third spacer;
   depositing an interlayer dielectric material on the semiconductor substrate, a portion of the first semiconductor layer, the third spacer, the second spacer, and the first pillar adjacent to the third spacer;
   performing a chemical mechanical polish to a top of the third spacer, the second spacer and the first pillar;
   removing the first dielectric material and the third dielectric material;
   removing a portion of the interlayer dielectric material to a surface of the first semiconductor layer;
   depositing a metal layer over the vertical field effect transistor and the semiconductor substrate; and
   removing the metal layer from the top of the third spacer, the first spacer, and the interlayer dielectric material.

* * * * *